United States Patent
Aggarwal et al.

(10) Patent No.: US 7,556,189 B2
(45) Date of Patent: Jul. 7, 2009

(54) LEAD-FREE BONDING SYSTEMS

(75) Inventors: Ankur Aggarwal, Smyrna, GA (US); Isaac Robin Abothu, Atlanta, GA (US); Pulugurtha Markondeya Raj, Atlanta, GA (US); Rao R. Tummala, Stone Mountain, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 699 days.

(21) Appl. No.: 11/138,011

(22) Filed: May 26, 2005

(65) Prior Publication Data

US 2005/0274227 A1    Dec. 15, 2005

Related U.S. Application Data

(60) Provisional application No. 60/574,458, filed on May 26, 2005.

(51) Int. Cl.
*H01L 21/02* (2006.01)
*B05D 1/00* (2006.01)

(52) U.S. Cl. .............. 228/120; 228/122.1; 228/123.1; 228/124.1; 228/124.5; 228/220; 420/469; 420/470; 420/501; 420/502; 427/453; 427/455; 427/530; 427/123; 427/126.3; 106/286.1; 106/286.4; 106/286.7; 106/286.8

(58) Field of Classification Search .............. 420/469, 420/470, 501, 502; 228/120, 122.1, 123.1, 228/124.1, 124.5, 220; 427/453, 455, 530, 427/123, 126.1, 126.3; 438/21, 104, 188, 438/121, 125, 758; 106/286.1, 286.4, 286.7, 106/286.8
See application file for complete search history.

(56) References Cited

U.S. PATENT DOCUMENTS

| | | | | |
|---|---|---|---|---|
| 4,135,914 A | * | 1/1979 | Vuletic et al. ................ | 75/490 |
| 4,975,333 A | * | 12/1990 | Johnson et al. .............. | 428/570 |
| 4,998,542 A | * | 3/1991 | Kallianos et al. ............ | 131/365 |
| 5,047,380 A | * | 9/1991 | Tour et al. .................... | 502/158 |
| 5,296,334 A | * | 3/1994 | Castaldi et al. .......... | 430/280.1 |
| 5,730,792 A | * | 3/1998 | Camilletti et al. ...... | 106/287.14 |
| 5,928,404 A | * | 7/1999 | Paruchuri et al. ............. | 75/255 |

(Continued)

OTHER PUBLICATIONS

L.L. Ye, Z. H. Lai, J. Liu and A. Thölen; "Recent achievement in microstructure investigation of Sn0.5Cu3.5Ag lead-free alloy by adding boron"; Proceedings of the IMAPS/IEEE-CPMT 4th Symposium on Materials in Electronic Packaging, Mar. 15-17th, 1999, Braselton, GA, USA, pp. 262-267.

(Continued)

*Primary Examiner*—Jessica L Ward
*Assistant Examiner*—Erin B Saad
(74) *Attorney, Agent, or Firm*—Ryan A. Schneider, Esq.; Troutman Sanders LLP

(57) ABSTRACT

Nano-structured interconnect formation and a reworkable bonding process using solder films. Large area fabrication of nano-structured interconnects is demonstrated at a very fine pitch. This technology can be used for pushing the limits of current flip chip bonding in terms of pitch, number of I/Os, superior combination of electrical and mechanical properties as well as reworkability. Sol-gel and electroless processes were developed to demonstrate film bonding interfaces between metallic pads and nano interconnects. Solution-derived nano-solder technology is an attractive low-cost method for several applications such as MEMS hermetic packaging, compliant interconnect bonding and bump-less nano-interconnects.

18 Claims, 12 Drawing Sheets

U.S. PATENT DOCUMENTS

| | | | | |
|---|---|---|---|---|
| 5,962,133 | A | * | 10/1999 | Yamaguchi et al. .......... 428/403 |
| 6,062,461 | A | * | 5/2000 | Sparks et al. ............ 228/123.1 |
| 6,077,344 | A | * | 6/2000 | Shoup et al. ................... 117/9 |
| 2003/0146415 | A1 | * | 8/2003 | Minami et al. .............. 252/500 |

OTHER PUBLICATIONS

K. Mohankumar and A. A. O. Tay, "*Nano-particle reinforced solders for fine pitch applications*", Proceedings of 6$^{th}$ Electronic Packaging and Technology Conference, pp. 455-461, Dec. 2004.

Andre Lee, K.N. Subramanian, Jong-Gi Lee, "*Development of Nanocomposite Lead-Free Electronic Solders*", 10th International Symposium on Advanced Packaging Materials: Processes, Properties and Interfaces, Mar. 16-18, 2005, Irvine, CA, USA.

*International Technology Roadmap for Semiconductors—Assembly and packaging (2003 edition)*; http://public.itrs.net/Files/2003ITRS/Home2003.htm.

S. Bansal, A. Saxena, R.R. Tummala; "*Nanocrystalline Copper and Nickel as Ultra High-Density Chip-to-Package Interconnections*," 2004 Electronic Components and Technology Conference, pp. 1647-1651.

Q. Zhu, L. Ma and S. K. Sitaraman, "*Design and optimization of a novel compliant off-chip interconnect—one-turn helix*" ECTC, 2002, pp. 910-914.

* cited by examiner

LEAD-FREE BONDING SYSTEMS

BENEFIT CLAIMS TO PRIOR APPLICATIONS

This application claims the benefit of U.S. Provisional Application No. 60/574,458, filed 26 May 2005.

GOVERNMENT INTERESTS

The present invention was made with government support by the National Science Foundation (NSF) through NSF EEC-9402723. The Government has certain rights in this invention.

FIELD OF THE INVENTION

The present invention is generally related to lead-free bonding systems, and more specifically related to a solution derived, lead-free bonding interface with thin film and powder processing for bonding chip to package interconnects for nano wafer level packaging.

BACKGROUND OF THE INVENTION

The National Electronics Manufacturing Initiative (NEMI) has endorsed Sn—Ag—Cu as the lead-free solder standard for the electronics industry. New solder materials have been reported by microalloying of grain refining elements into Sn—Ag and Sn—Cu—Ag systems to achieve better mechanical properties. [1-3]. These materials are generally made by co-milling of different powders. Milling of materials such as Sn—Ag and Sn—Ag—Cu does not control particle size, impurities, composition, and homogenity.

Another method used to deposit lead-free solder films is electroplating. Unfortunately, electroplating does not control the composition accurately, and is not widely demonstrated to achieve ternary compositions.

Therefore, it can be seen that a need exists for a solder deposition process that can control the composition accurately, as well as be free from any impurities which is inherent in processes such as milling. The invention described herein can serve as an excellent bonding technology for bonding chip to package interconnects.

These interconnects can provide improved electrical performance while lowering the stresses at the interfaces by orders of magnitude. It is to such a structure, being a high-aspect-ratio metal-coated polymer structure, that the present invention is primarily directed. This technology when used in conjunction with polymer-based structures can also simplify the processing steps and result in tremendous cost reductions.

REFERENCES

The following references are noted both hereinabove and hereinbelow.

[1] L. L. Ye, Z. H. Lai, J. Liu and A. Thölen; "*Recent achievement in microstructure investigation of Sn0.5Cu3.5Ag lead-free alloy by adding boron and zirconium*"; Proceedings of the IMAPS/IEEE-CPMT 4th Symposium on Materials in Electronic Packaging, Mar. 15-17, 1999, Braselton, Ga., USA, pp. 262-267.

[2] K. Mohan Kumar and A. A. O. Tay, "*Nano-particle reinforced solders for fine pitch applications*", Proceedings of 6th Electronic Packaging and Technology Conference, pp. 455-461, December, 2004.

[3] Andre Lee, K. N. Subramanian, Jong-Gi Lee, "*Development of Nanocomposite Lead-Free Electronic Solders*", 10th International Symposium on Advanced Packaging Materials: Processes, Properties and Interfaces, Mar. 16-18, 2005, Irvine, Calif., USA.

[4] *International Technology Roadmap for Semiconductors—Assembly and packaging* (2003 *edition*); http://public.itrs.net/Files/2003ITRS/Home2003.htm.

[5] S. Bansal, A. Saxena, R. R. Tummala; "*Mechanical Properties of ECAE Nano-crystalline Copper and Nickel*," ICMAT 2003, Singapore, December 2003.

[6] Q. Zhu, L. Ma and S. K. Sitaraman, "*Design and optimization of a novel compliant off-chip interconnect-one-turn helix*" ECTC, 2002, pp 910-914.

[7] C. Jeffrey Brinker, George W. Scherer, *Sol-gel science: the physics and chemistry of sol-gel processing*; Boston: Academic Press, c1990.

SUMMARY OF THE INVENTION

Briefly described, in a preferred form, the present invention provides alternate approaches to achieve compositions with required stoichiometry into the alloy system, both in thin film and powder form. Two solution-derived approaches include sol-gel and electroless plating, and both have been demonstrated to achieve these nano-dimensional interfaces.

The sol-gel approach can achieve nano-grained films with easy incorporation of suitable additives to improve the mechanical properties. The electroless plating approach can selectively deposit thin films of metals and alloys at less than 50° C. temperature and is hence another attractive processing route for nano-solder based reworkable bond interfaces.

The present invention can be used for pushing the limits of current flip chip bonding in terms of pitch, number of I/Os, superior combination of electrical and mechanical properties as well as reworkability. A number of other advantages are gained from using the present innovations. Chip to package interconnect length is minimized, thereby reducing the electrical parasitics considerably. Also, a high bandwidth between chips can be achieved because of the large number of area array I/O connections at extremely fine pitches. While current assembly equipment may not be suitable for placement and alignment, the present invention will stimulate new innovations in advanced equipment and self assembly processes.

Solution-derived nano-solder technology is an attractive low-cost method for several applications such as MEMS hermetic packaging, compliant interconnect bonding and bumpless nano-interconnects. These bonding interfaces convert to liquid around 220-270 C and are therefore reworkable.

In a preferred embodiment, the present invention is a novel method to synthesize lead-free solder using a sol-gel process. The invention can include the step of depositing the solder films using process including a spin-coating process, dip coating, curtain coating, and meniscus coating.

Reduction of the sol-derived oxides can be used to get the lead-free solders, and is preferably performed in a hydrogen or other reducing gas environment. This step of reduction is preferably run at approximately between 200° C.-500° C. The invention can include reducing the reduction temperature by controlling the hydrolysis of the sol.

In another preferred embodiment, the present invention is a novel powder synthesis of lead-free solders with accurate binary, tertiary or higher compositions. It can also include the synthesis of exact stoichiometric compositions using the sol-gel process by mixing the right amount of precursors.

In yet another preferred embodiment, the invention can be a novel method to synthesize lead-free solder using a solution reduction process, and further using the solution-reduction process at temperatures approximately between 25° C.-45° C.

Further described is a way to modify the bath salt/ion compositions to tune the plated solder film composition, and a bonding/assembly system of a chip to a substrate with the above lead-free solder interfaces, for electrical and mechanical connections.

The lead-free solders of the present invention can be used as interfaces for hermetic sealing MEMS/microfluidic packages. The solution-reduction processes can be used to selectively coat on metal pads.

Additives such as Zr, V, Nb, titania, alumina or other pinning agents can be incorporated through the sol-gel process to improve the creep properties of the solder. Such additives can also improve the strength and the fatigue resistance.

Solution-derived solder films can be used on Si, FR-4, alumina, glass or other packaging substrates.

These and other objects, features and advantages of the present invention will become more apparent upon reading the following specification in conjunction with the accompanying drawings.

DETAILED DESCRIPTION OF A PREFERRED EMBODIMENT

Figure 1:
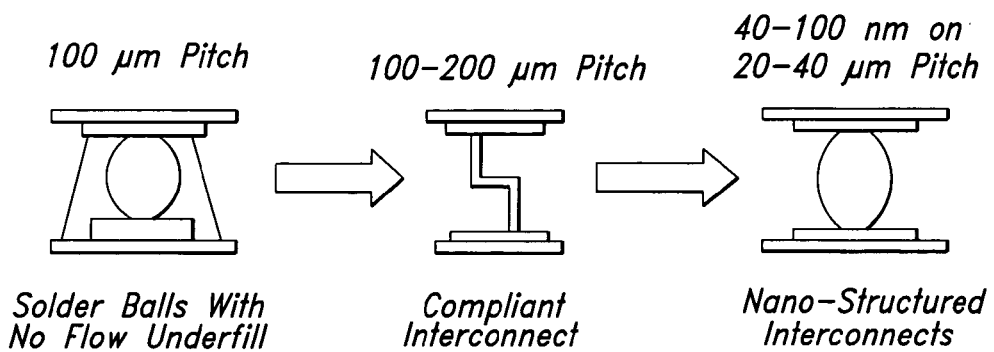
FIG. 1 illustrates fine-pitch wafer level interconnect research progressing towards nano-interconnects.

IC packaging is one of the key enabling technologies for microprocessor performance. As performance increases, the technical challenges increase in the areas of power delivery, heat removal, I/O density, and thermo-mechanical reliability.

These are the most difficult challenges for improving performance and increasing integration, along with decreasing manufacturing cost.

Decreasing I/O pitch is one of the key technological barriers identified by the 2003 International Technology Roadmap for Semiconductors (ITRS) [1]. See Table 1. The present invention goes beyond the ITRS roadmap in terms of (1) Signal and power integrity (2) I/O connections, and (3) Reworkability. Therefore, the scope of the present invention is not limited by the ITRS roadmap, but goes beyond it by way of a disruptive approach to IC packaging.

TABLE 1

| ITRS Roadmap for Interconnect Pitch (μm) | | | | | |
|---|---|---|---|---|---|
| | Year | | | | |
| | 2004 | 2007 | 2010 | 2013 | 2016 |
| Wire bond | 25 | 20 | 20 | 20 | 20 |
| Area Array Flip Chip | 150 | 120 | 100 | 90 | 80 |
| Peripheral Flip Chip | 60 | 30 | 20 | 20 | 15 |

Downscaling the traditional solder bump interconnect will not satisfy the thermo-mechanical reliability requirements at very fine pitches of the order of 30 μm and less. Alternate interconnection approaches, such as compliant interconnects, typically require lengthy connections, and are therefore limited in terms of electrical properties, although expected to meet the mechanical requirements.

A combination of decreasing pitch, environmental concerns (Pb/Halogen free), mechanical stress concerns, electrical requirements (e.g. current density), and cost constraints will drive the development of interconnect materials, processes and designs in entirely new directions. A new paradigm is therefore necessary for cost, performance and reliability of IC-package interconnections. This can be achieved by defining and exploring solutions beyond solder bumps and compliant interconnects by way of interconnect innovations, combined with new designs, novel and reworkable assembly technologies.

Next Generation Interconnect Requirements

The next generation IC-package interconnect requires a technology that is low cost, reworkable, possess good electrical properties, good reliability, and should be easily testable at the wafer level with good co-planarity. To achieve the requirements of very fine pitch (as projected by ITRS) with conventional interconnects and materials, one has to accept a trade-off in electrical and mechanical performance, and possibly cost. This trade-off between electrical and mechanical performance is analyzed with thermo-mechanical and electrical modeling as detailed hereinafter.

Nano Interconnect Proposal

The present invention proposes reworkable nano interconnections as a new interconnect paradigm for potential low cost, highest performance and reliability—not trading one for the other. This approach also addresses "reworkability" that technologies such as "chips first" fail to address.

In this approach, high speed comes from the smallest interconnects with the best electrical properties. The mechanical integrity and reliability come from the improved mechanical properties of materials at nano-scale. Low cost comes from thin film or self assembly deposition of nano structures on the entire 300 mm wafer. Nano-scale interconnects can offer these benefits, as well as lower the pitch along with improved electrical and mechanical performance to accommodate future system demands; thus realizing the goal of unlimited I/Os.

Reworkability is needed to be able to replace bad chips with good chips, particularly with MCM, SIP or SOP approaches. The present invention proposes thin liquid interfaces to accomplish this on the package side.

Low Cost Wafer Level Packaging at Nano-Scale

Nano wafer level packaging of ICs is expected to be cost effective since nano-scale connections are deposited on the entire 300 mm wafer with thousands, and possibly millions, of connections. These connections are also expected to be used to test and burn-in at the wafer level and at high speed. These connections are proposed to be integrated with the back-end fabrication with Copper-low K process technology.

Best Electrical and Mechanical Properties

FIG. 1 illustrates fine-pitch wafer level interconnect research progressing towards nano-interconnects. In the current solder bump technology shown in FIG. 1, if the height of interconnects is reduced by a factor of five from the current 200 µm pitch, the mechanical reliability of interconnects will be severely reduced, unless 1) underfill is used, which adds complexity and cost, or 2) the board CTE is matched to that of silicon.

Figure 2:
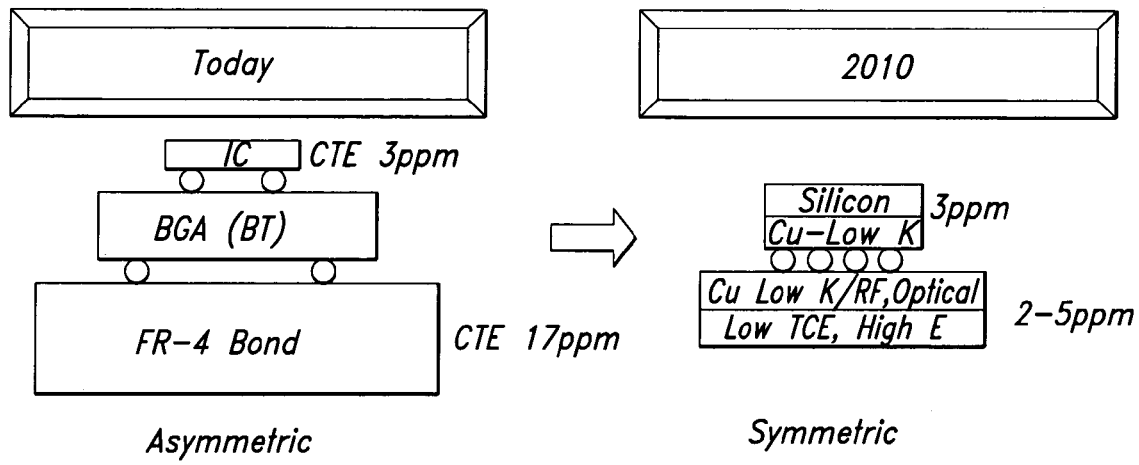
FIG. 2 illustrates the present concept of nano-interconnects with mechanically symmetric high-density packaging according to a preferred embodiment.

The nano interconnections appear to illustrate for the first time that neither of the above may be necessary. Applicants realize, however, that higher temperature boards with higher modulus may be highly desirable for fine line lithographic reasons, and these type of boards invariably tend to be lower in CTE. Nano-interconnects can be therefore be realized easily with lower CTE (2-4 ppm) boards leading to symmetrical structures on both sides of the joint as is shown in FIG. 2. [2] FIG. 2 illustrates the present concept of nano-interconnects with mechanically symmetric high-density packaging.

Choice of Interconnect Materials

The interconnect signal delay between the IC and the package depends strongly on the interconnect material used. Materials with lowest resistivity that are processable and manufacturable, and yet maintain nano-scale structures and properties at assembly and operating temperatures, become a logical choice for the interconnect system.

Copper and other high temperature materials are herein selected as the interconnect materials, but the focus is on copper as the interconnect material. Nano-structured copper shows significant improvements in fracture strength and toughness [5] that can address the reliability concerns with fine-pitch interconnects. The advantage of copper as a good electrical conductor is undisputed. Conductivity of pure copper is $5.96 \times 10^7$ $Ohm^{-1}m^{-1}$ as compared to a conductivity of $6.9 \times 10^6$ $Ohm^{-1}m^{-1}$ for Pb—Sn eutectic solders. In addition, copper has good electro-migration stability that renders high current carrying capability to the interconnects.

Reworkability

The present invention is directed to nano-dimensional solder films as an efficient way to achieve reworkable interfaces with lowest electrical parasitics. The National Electronics Manufacturing Initiative (NEMI) has endorsed Sn—Ag—Cu as the lead-free solder standard for the electronics industry, and hence Sn—Ag—Cu and Sn—Ag alloys have been selected herein to function as a reworkable bonding interface between the interconnect and the package.

Three approaches, sol-gel, electroless plating and cosputtering have been demonstrated to achieve such nano-dimensional interfaces. The sol-gel approach can achieve nano-grained films with easy incorporation of suitable additives to improve the mechanical properties. Electroless plating can selectively deposit thin films of metals and alloys at less than 50° C. temperature, and is hence another attractive processing route for nano-solder based reworkable bond interfaces.

Between the two material systems, copper is advantageous due to high yield strength compared to lead-free solders. On the other hand, use of lead-free solder makes the package reworkable, since it is possible to take off bad chips and replace them with good chips.

Technologies to Demonstrate Thin Reworkable Interfaces

Applicants utilized two main technologies, sol-gel techniques and electroless plating, to demonstrate thin reworkable interfaces. Sn—Ag and Sn—Cu are the two compositions that were demonstrated. Ternary alloys such as Sn—Ag—Cu may also be used for the bonding interfaces.

Sol Preparation

Synthesis of nano-metals and nano-alloys of specific size and morphology is a key aspect in the development of new materials. The solution-sol-gel (SSG) process is a highly versatile process that can lead to powders, films, fibers, spheres, monoliths, aerogels, and xerogels, for example, of high purity and homogeneity. It offers distinct advantages such as low processing temperature, better control over stoichiometry, and chemical homogeneity.

Purity of SSG derived materials can be controlled by the purity of the starting chemicals, while homogeneity can be controlled by precisely controlling the hydrolysis, condensation and polymerization reactions. The starting precursors in the SSG process can be metal-organic compounds, inorganic-metal salts, for example. The key, however, is to achieve ultra homogeneous mixing at atomic to molecular levels. Preparation of high purity ceramic powders via the SSG process has previously been reported [7]. Yet, there appear to be no reports on the synthesis of lead-free solders by solution-sol-gel (SSG) processing. One of the objectives of the present invention is to apply the strategy of atomic to molecular level mixing of the precursors and synthesize nano lead-free solder materials by sol-gel technology.

Figure 3:
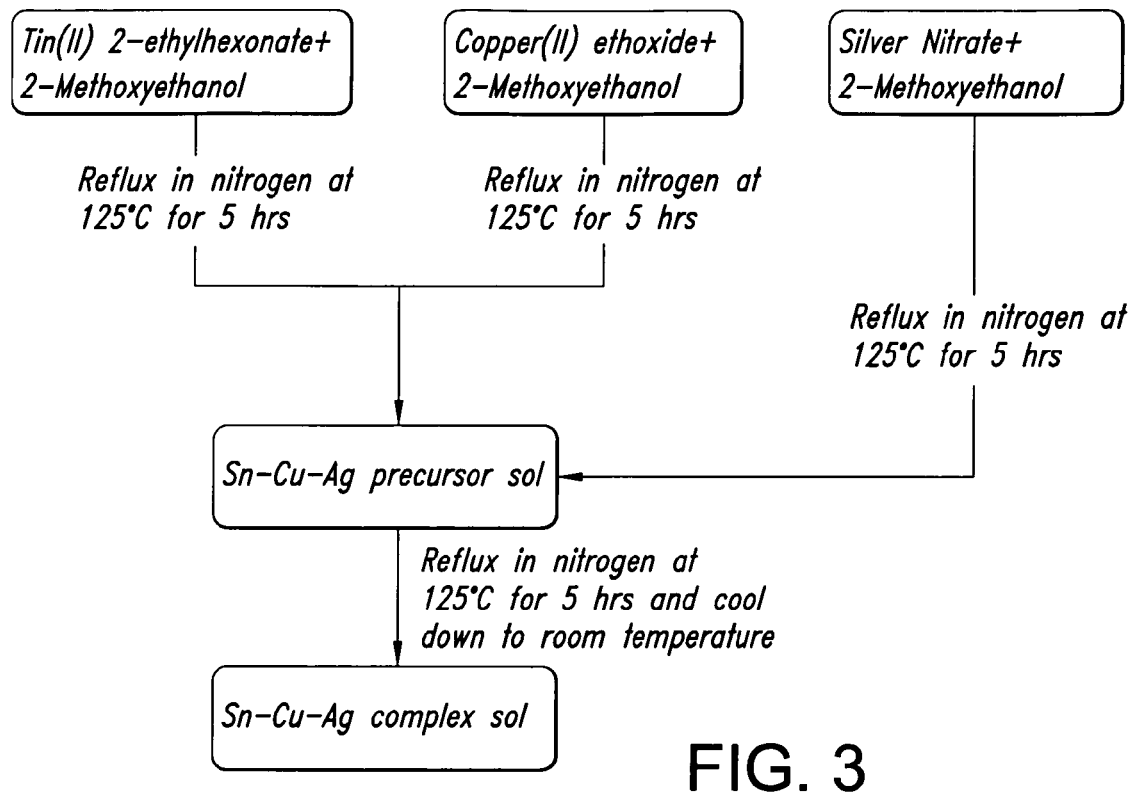
FIG. 3 is a flowchart for the synthesis of SnAgCu lead-free solder by sol-gel technology according to a preferred embodiment of the present invention.

The experimental procedure adopted for the synthesis of $Sn_{96}Ag_{3.5}Cu_{0.5}$ by sol-gel process is illustrated in FIG. 3. Tin (II) 2-ethylhexonate $[CH_3(CH_2)_3CH(C_2H_5)CO_2]_2Sn$ (Aldrich), copper (II) ethoxide $Cu(OC_2H_5)_2$ (Alfa Aesar) and silver nitrate ($AgNO_3$) (Alfa Aesar) were used in this process. Initially, a stoichiometric amount of Tin (II) 2-ethylhexanoate was dissolved in 2-methoxyethanol (2-MOE) as solvent in a flask and refluxed at 125° C. for 5 hours in nitrogen atmosphere. Subsequently, copper (II) ethoxide was dissolved in 2-MOE in a separate flask and refluxed in nitrogen atmosphere at 125° C. for 5 hours. Both the Sn and Cu precursor solutions were cooled to room temperature.

Finally, silver nitrate was dissolved in 2-MOE in a separate flask and refluxed at 125° C. for 5 hours. This silver precursor solution was cooled to room temperature and then added to the Sn—Cu solution and refluxed at 125° C. for 5 hours to obtain a clear Sn—Ag—Cu precursor solution. A similar procedure was adopted for Sn—Cu.

Reduction of Metal/Alloy System

Reduction of Copper, Sn—Cu and Sn—Ag—Cu precursors was performed in a forming gas environment. Sn—Ag—Cu solders were formed at 400° C. while Sn—Cu precursor was reduced at only a temperature of 500° C. Bare silicon wafers coated with Cr—Au were spin coated with precursor solutions, and then spin dried before being reduced in the forming gas environment in a tube furnace. The reduction time for these wafers was about 5 hours.

Rapid Thermal Processing (RTP) was also evaluated as a technique to get faster reduction of precursors into metallic films. In this case the RTP processing time was 5 minutes in a forming gas (3% $H_2/N_2$) flow of 5 SCCM at 600° C.

Nano Lead-Free Solder

Figure 4:
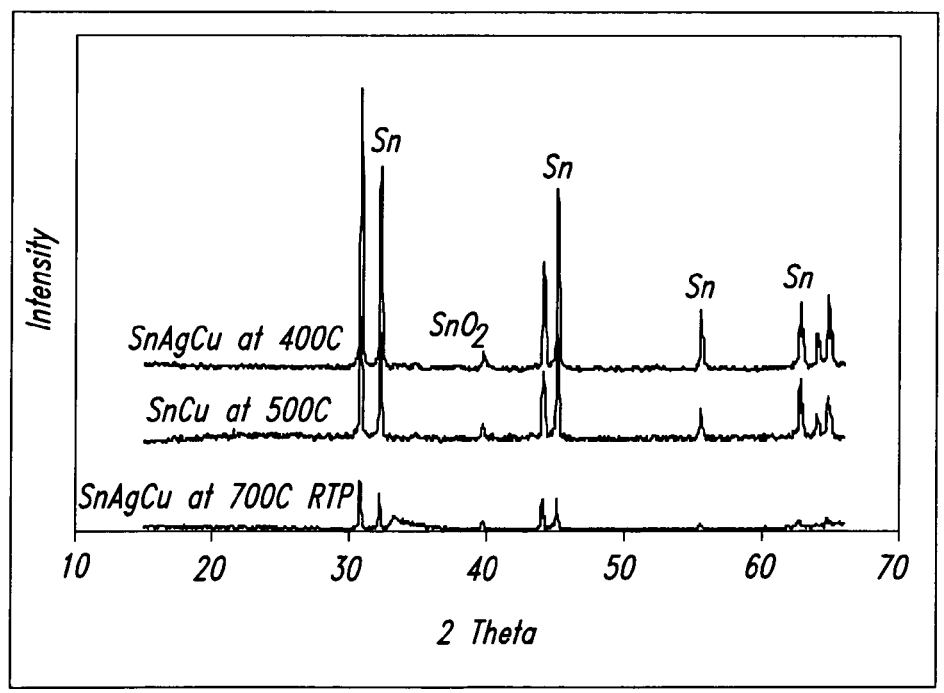
FIG. 4 is an X-Ray Spectra of SnAgCu and SnCu lead-free solders at different temperatures.
Figure 5:
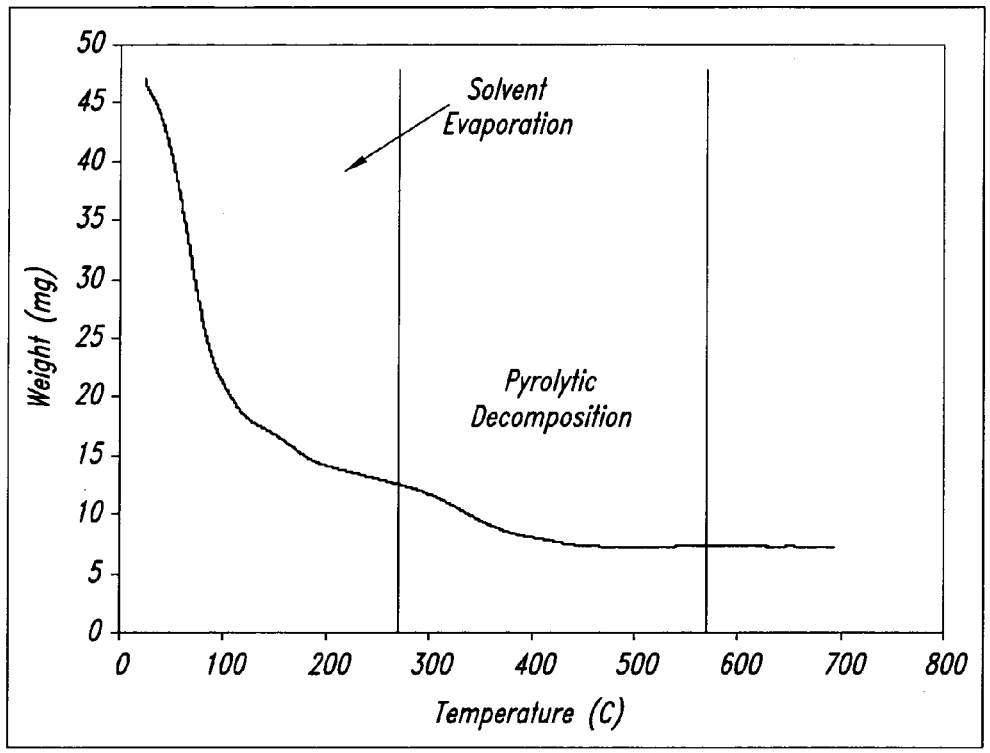
FIG. 5 is a Thermal Gravimetric Analysis (TGA) for Sn—Ag—Cu lead-free solder precursor.

X-Ray spectra using CuKα radiation were measured on reduced alloy films. The spectra shown in FIG. 4 were observed for the Sn—Ag—Cu films reduced at different temperatures. The sol for synthesizing lead-free alloys was characterized with Thermal Gravimetric Analysis (TGA) before further processing. FIG. 5 shows a sharp decrease in weight until 125° C., corresponding to solvent evaporation. It is seen that the pyrolytic decomposition of the precursor completes at around 450° C. and it can be lowered to 400° C. by increasing the pyrolysis time.

Both $SnCu_{0.5}$ and $Sn_{96}Ag_{3.5}Cu_{0.5}$ were synthesized from reduction in forming gas. For Sn—Cu precursor, no Sn peaks were evident at 400° C. even after the reduction was carried for seven hours in forming gas. The XRD peaks mostly correspond to crystalline $SnO_2$ with an amorphous background. The metallic system was formed above 500° C. in this case.

Figure 18:
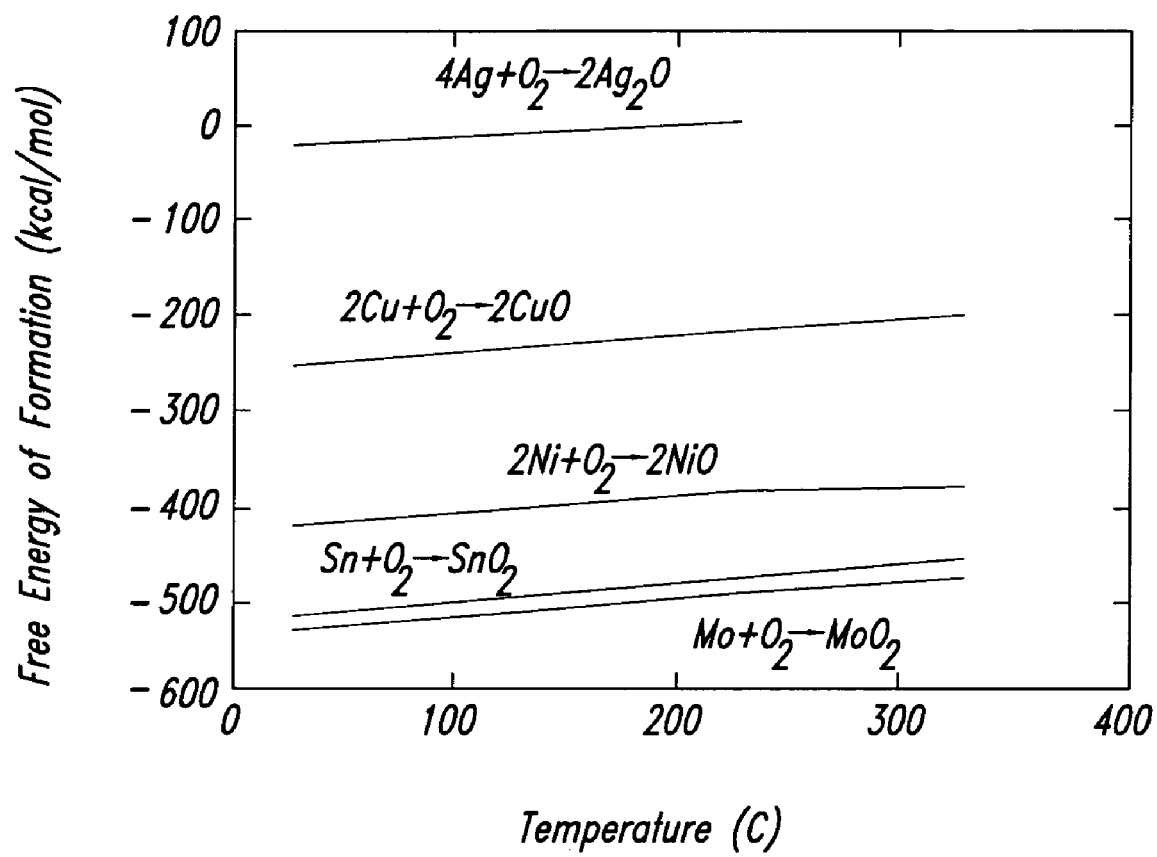
FIG. 18 is an Ellingham diagram according to a preferred embodiment of the present invention.

On the other hand, Sn peaks were observed at 400° C. with the Sn—Ag—Cu precursor. It can be seen from the Ellingham diagram (FIG. 18) that Ag and Cu will be easily reduced as compared to tin. The presence of Ag and Cu also enabled easy reduction of tin oxide to tin at 400° C. that was not possible with Sn—Cu precursor. The lowered thermodynamic activity of Sn in presence of Ag and Cu destabilized the tin oxide in Sn—Ag—Cu and enabled the reduction at lower temperatures.

Figure 6:
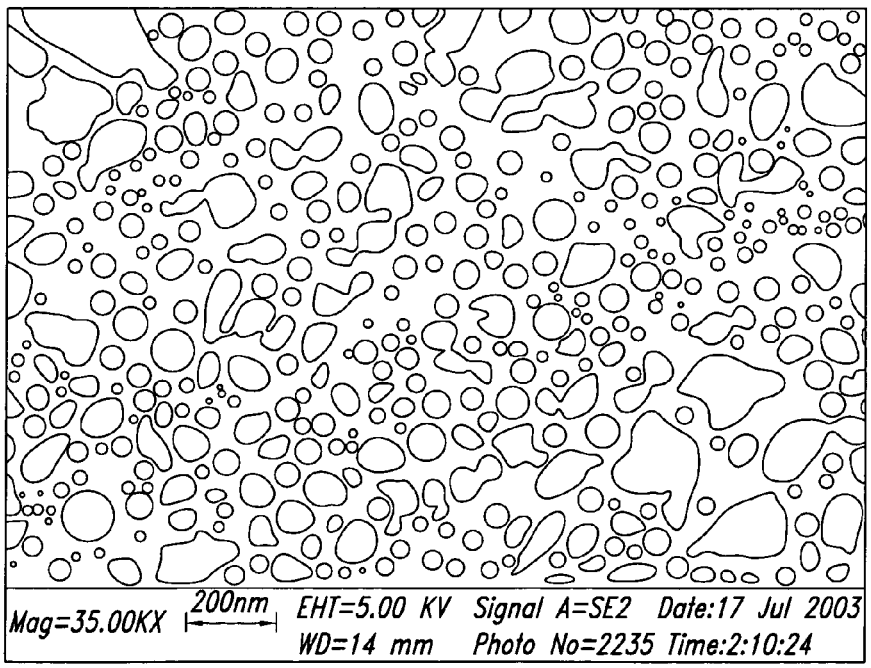
FIG. 6 is a Field Emission Scanning Electron Micrograph of reduced Sn—Ag—Cu lead-free solder on a Cr—Au coated silicon substrate.
Figure 7A:
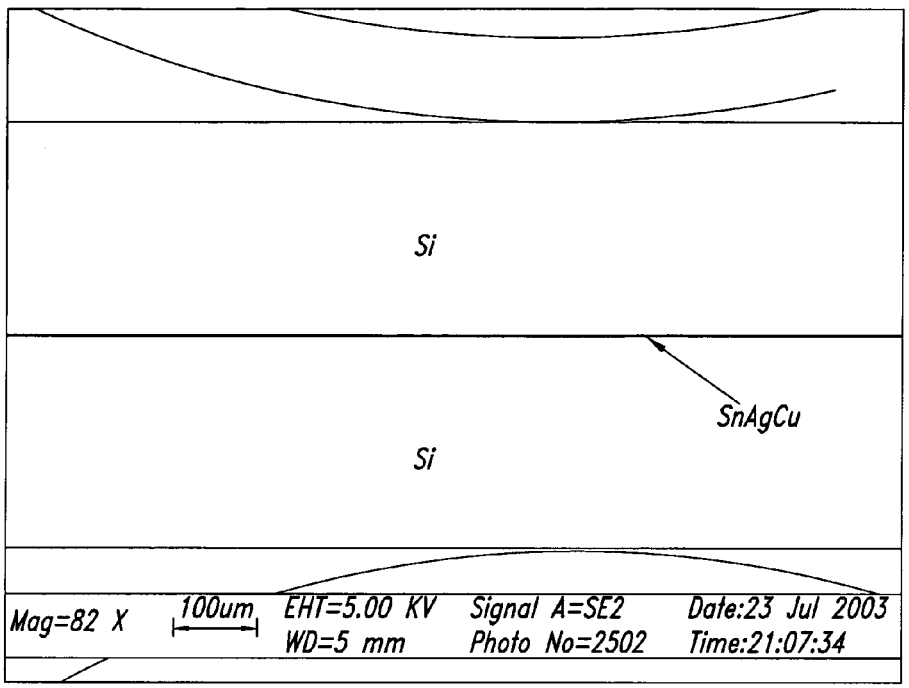
FIG. 7(a) is a micrograph of the Sn—Ag—Cu interface joining two Si wafers.
Figure 7B:
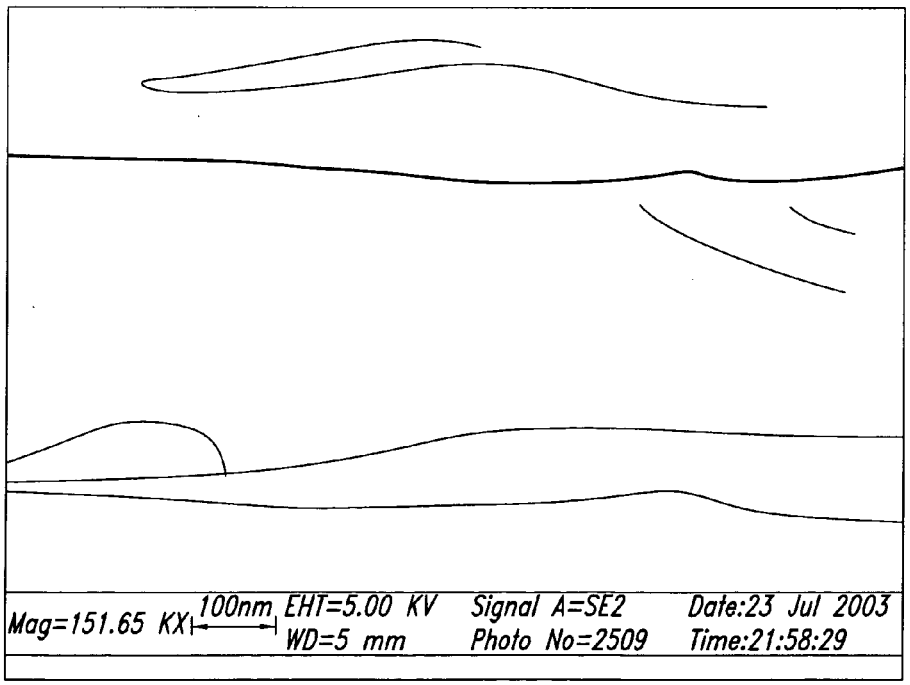
FIG. 7(b) is a high magnification SEM of a 200 nm nano lead-free solder interface bonding two silicon wafers.

A Field Emission Scanning Electron Microscope was used to observe the morphology of Sn—Ag—Cu formed on a Cr—Au coated silicon wafer. See FIG. 6. Since the film thickness is of the order of 100 nm, nanoscale interfacial bonding can be achieved from reflow. FIGS. 7(*a*) and 7(*b*) are micrographs of two silicon wafers bonded with such thin interfaces. The thickness of the bonding interface is 200 nm. The grains, seen as specks in the film, are of the order of 10 nm. The mechanical properties of these structures are expected to be far superior to conventional lead-free solders.

Electroless Plating of Lead-Free Alloys

For electroless plating of alloys, the control of final alloy composition and incorporation of additives requires careful control of the plating bath, selection of reducing agents, and control over processing conditions. Unlike metal-organic precursors used in the sol-gel approach, this approach uses soluble salts in which the metal ions would be reduced to the metal using reducing agents.

Metal nanoparticles are often formed directly in solution by reduction of metal salts. This is accomplished by using strong reducing agents such as alkali metals, and alkali metal borohydrides. For example, silver salts (e.g., $AgNO_3$, AgCl) or gold salts (e.g., $HAuCl_4$) can be reduced by sodium borohydride to form silver or gold nanoparticles. For some metals, such as Ag, Au, and Pt, for example, weaker reducing agents (alcohols, DMF, ethylene glycol, and citric acid, for example) can be used in forming nanoparticles, which is a big advantage from the viewpoint of safety.

An electroless process was developed to produce a Sn—Ag alloy that can be deposited without an external power source. The different chemicals used and the process is discussed as follows:

Predip Solution (~400 ml) [Cataprep 404]: Mix thoroughly during addition
   Deionized water: 400 ml
   Cataprep Salts (404) [Shipley Chemicals]: 95.7584 grams Catalyst (~200 ml):
   Cataprep 404: 194 ml
   Cataposit 44 [Shipley Chemicals]: 6 ml Tin Plating Bath (~200 ml Solution):
   Deionized water: 200 ml
   Stannous Chloride: 0.76 grams
   Silver Nitrate anhydrous: 0.0258 grams
   Thiourea: 9.9 Grams
   Sulfuric Acid (conc.): 2.4 ml Plating Process:

| | | | |
|---|---|---|---|
| Pre-Catalyst Predip | Cataprep 404 | Room Temperature | 1 minute |
| Catalyst | Cataposit 44 | 46° C./115° F. | 5 minutes |
| Rinse | Deionized water | Room Temperature | Spray and rinse thoroughly |
| Electroless lead-free solder plating | | 46° C.-50° C. | Plate the desired thickness |

Figure 8:
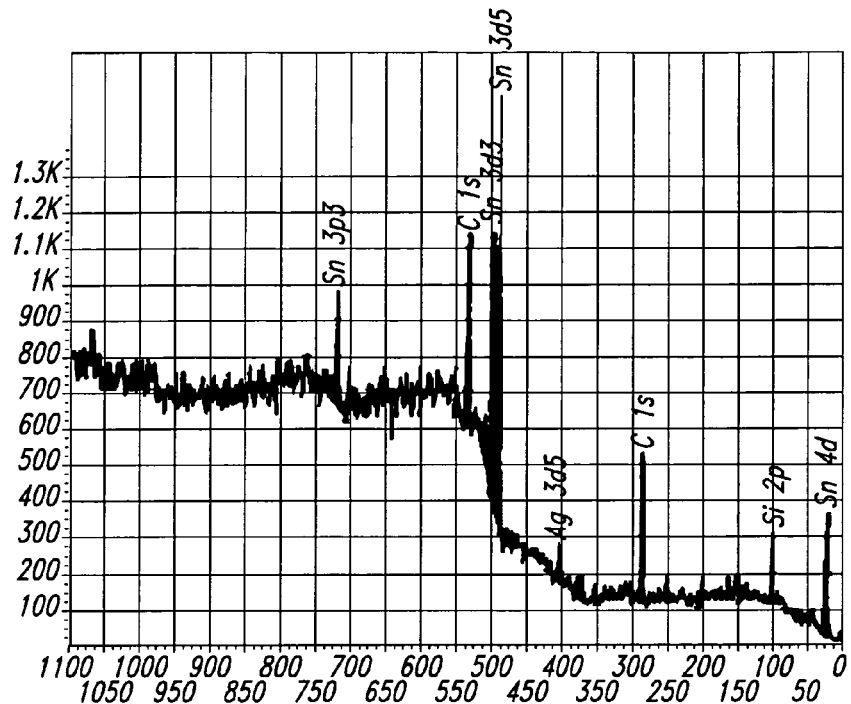
FIG. 8 is an XPS elemental analysis of electroless lead-free solder films according to preferred embodiments of the present invention.

Uniform composition of deposit and constant plating rate are maintained by rigid control of pH and concentration of all chemicals in the stabilized plating bath. Since the plating process is strictly chemical, it evenly coats all the metal pads on the plating surface. The deposited alloy is highly uniform in thickness as well as chemical and physical properties. The alloy composition, as determined from XPS elemental analysis was $Sn_{95.1}Ag_{4.9}$ by wt % and is shown in FIG. 8.

Suitable catalytic surface treatment was used to selectively deposit the alloy films on the metallic pads. The starting metal salts and reducing agents were optimized to achieve the required final lead-free alloy composition.

Figure 9:
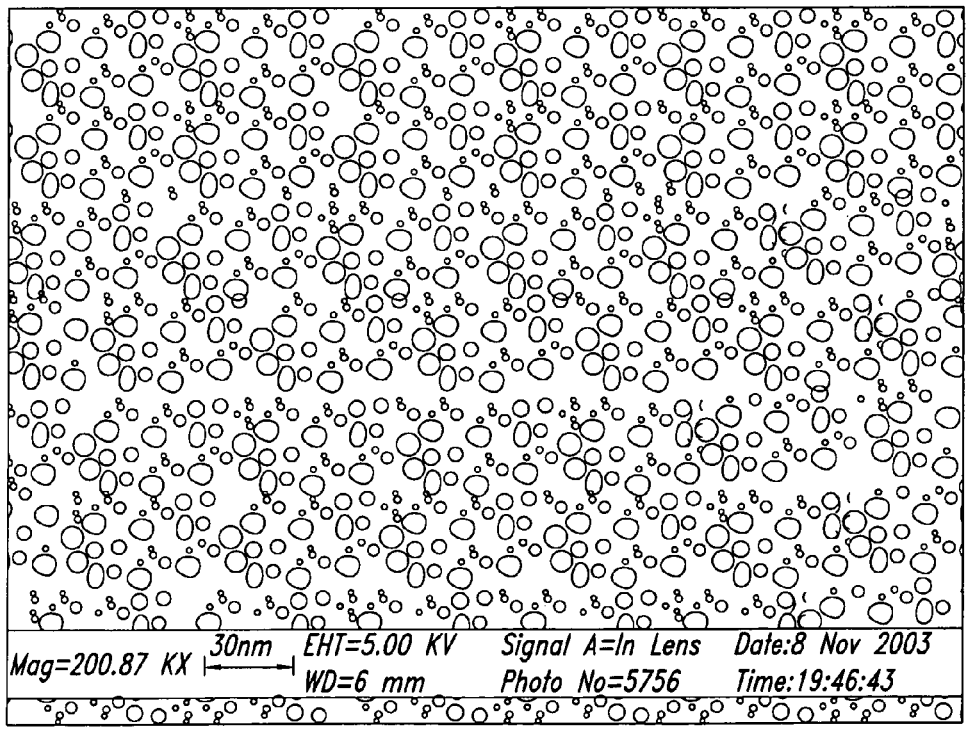
FIG. 9 is a high resolution SEM micrograph of Sn—Ag thin film obtained on copper pads using electroless plating.

Because the coating is deposited chemically as compared to electrolytic plating, the problems normally associated with electroplating (edge build-up, uneven thickness, no plating in corners and recesses, for example) are avoided herein. Moreover, as can be seen from the SEM micrograph of FIG. 9, nano-grained and nano-dimensional films can be achieved with relative ease.

Nano-Structured Copper Interconnect Fabrication

Processing of Nano-Structured Copper Interconnects

Electroplating is an ideal processing route to make the primary interconnects because of low cost, widely available infrastructure, and acceptance in the PWB and semiconductor industry. Nanograined copper was selected as the interconnect material in experiments for the present invention. From prior studies, the material shows significant improvements in fracture strength and toughness at nanoscale [5] that can address the reliability concerns with fine-pitch interconnects. As previously discussed, the conductivity of pure copper is $5.96 \times 10^7$ $Ohm^{-1} \cdot m^{-1}$ as compared to a conductivity of $6.9 \times 10^6$ $Ohm^{-1} \cdot m^{-1}$ for Pb—Sn eutectic solders. In addition, copper has good electro-migration stability that renders high current carrying capability to the interconnects. Thin reworkable interfaces with lowest electrical parasitics was accomplished on the wafer side by a cosputtering process developed by Hionix Inc.

Interconnect Pads

Copper Pads were first fabricated on a silicon substrate. A 0.5 µm titanium layer was first sputtered as a adhesion layer between copper and silicon. Thereafter, a 1.0 µm copper film was sputtered followed by etching of titanium and copper to provide the interconnect pads on the silicon wafer. Once again, a thin copper seed layer of 400 nm was sputtered as an electroplating seed layer.

Nano-Structured Copper Interconnect

Nano-structured copper interconnects were then fabricated using the SU-8 Series 2000™ (MicroChem Corp.) photoresist. SU-8 has very high optical transparency which makes it ideally suited for imaging near vertical sidewalls in very thick films, and is near UV (350-400 nm) and e-beam imageable. It has superb chemical resistance that makes it suitable for a variety of electrolytic plating bath chemistries. Another advantage includes faster drying of the film.

The SU-8 Series 2000™ photoresist has a very poor adhesion with copper. Therefore, to enhance the adhesion of the photoresist film with the copper seed layer a coupling agent, Omnicoat™ (MicroChem Corp.) was first spinned on to the silicon substrate with copper seed layer. SU-8 photoresist was then spinned, and exposed to yield the mold for interconnect plating. Nano-grained copper was then electroplated through the SU-8 mold to yield copper interconnects.

The grain size of the electroplated copper are of the order of 50-70 nm. One major drawback with nanocrystalline copper is the lack of thermal stability of grain structure with temperature. This can be easily addressed with appropriate additives that can prevent grain coarsening.

Barrier Metallurgy Deposition

Figure 10:
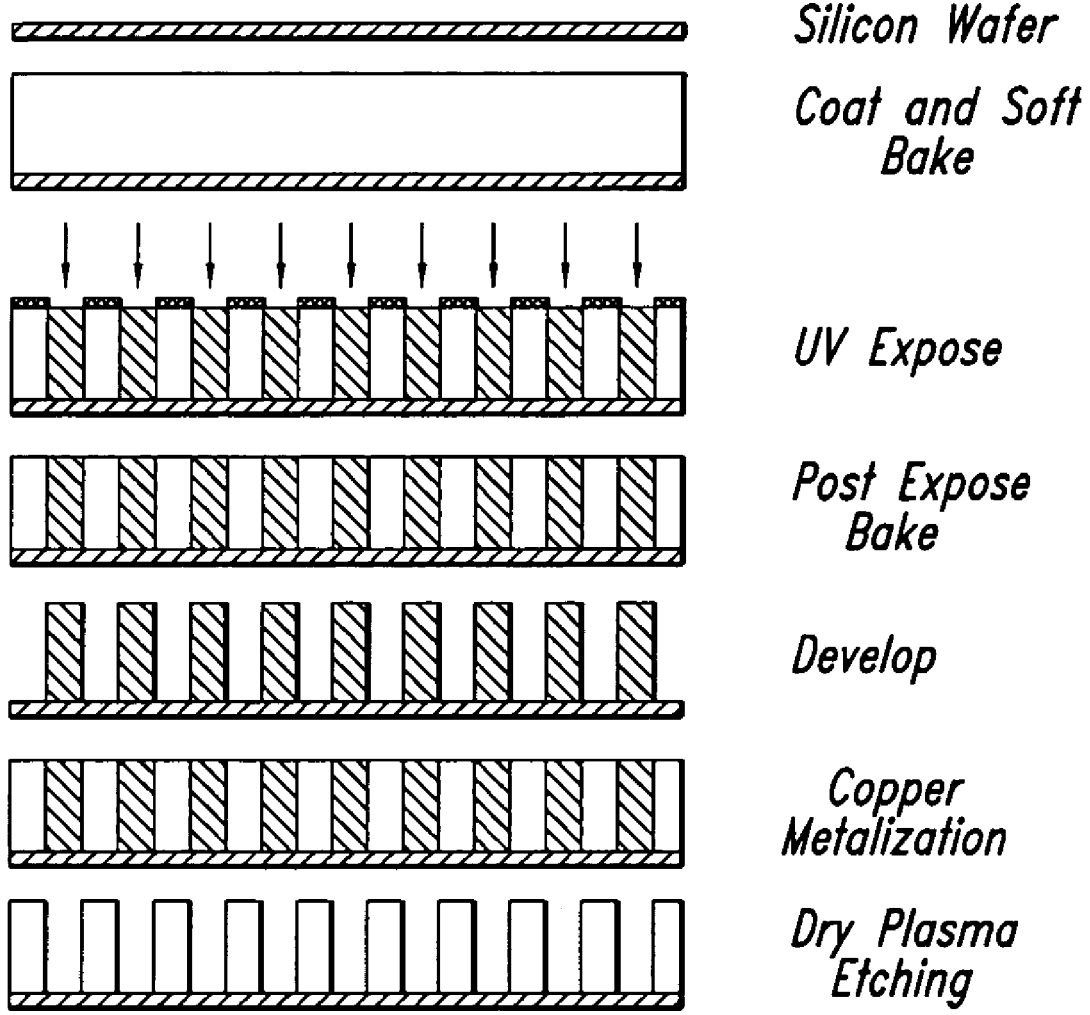
FIG. 10 is a baseline process for fabrication of high aspect ratio interconnects according to a preferred embodiment of the present invention.

FIG. 10 illustrates a process for the fabrication of high aspect ratio interconnects. The barrier preferably should be designed with appropriate metallurgy for the required wettability, diffusion barrier, adhesion and interfacial strength, since it is expected to be the weakest point. Ni—Au was used as the barrier metallurgy between the nano-copper interconnects and the reworkable lead-free solder interface to prevent diffusion of lead-free solder into the copper interconnect.

A thin barrier layer of Nickel and Gold was sputtered onto the wafer with SU-8 mold intact and thereafter patterned and etched to leave the barrier metallurgy on top of copper interconnects. The thickness of Nickel was approximately 200 nm and that of Gold was about 100 nm. It was also attempted to deposit the Ni—Au interface using the immersion plating process, but the process lead to peeling of the SU-8 film due to the highly corrosive environment and high temperature of the plating bath.

High aspect ratio nano-structured copper interconnects were fabricated in a single step using the SU-8 Series 2000™ (MicroChem Corp.) photoresist. SU-8 has very high optical transparency which makes it ideally suited for imaging near vertical sidewalls in very thick films, and is near UV (350-400 nm) and e-beam imageable. Resist thickness ranging from 50 µm to 200 µms can be achieved with single spin coat process. Besides, it has superb chemical resistance that makes it suitable for a variety of electrolytic plating bath chemistries. Other advantages include improved wetting on silicon, glass, metals and other low surface energy substrates and faster drying of the film.

Figure 11:
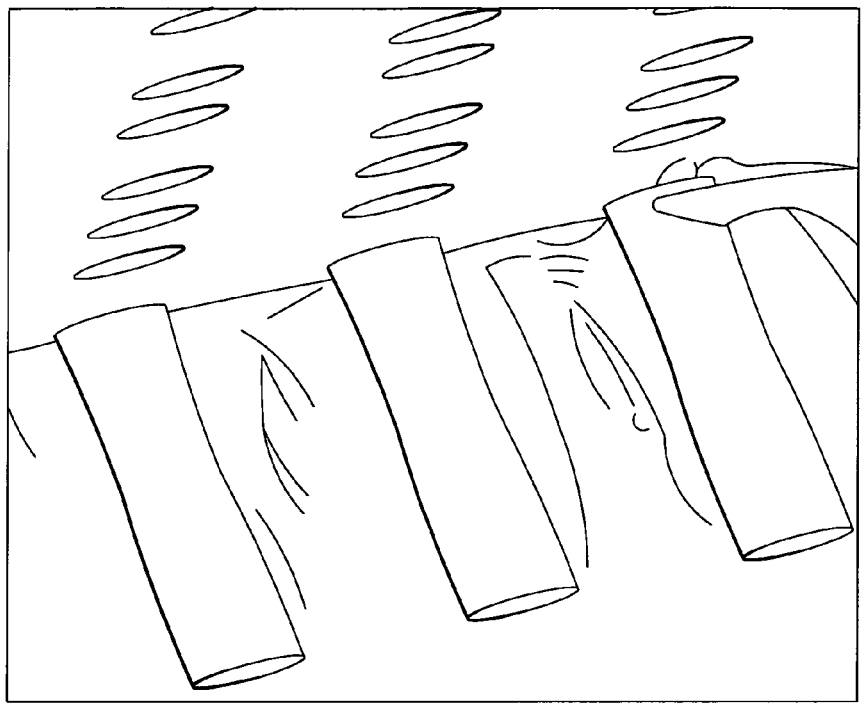
FIG. 11 illustrates high aspect ratio (1:5) openings in the SU-8 Series 2000™ Photoresist with a 40 μm pitch according to a preferred embodiment of the present invention.
Figure 12:
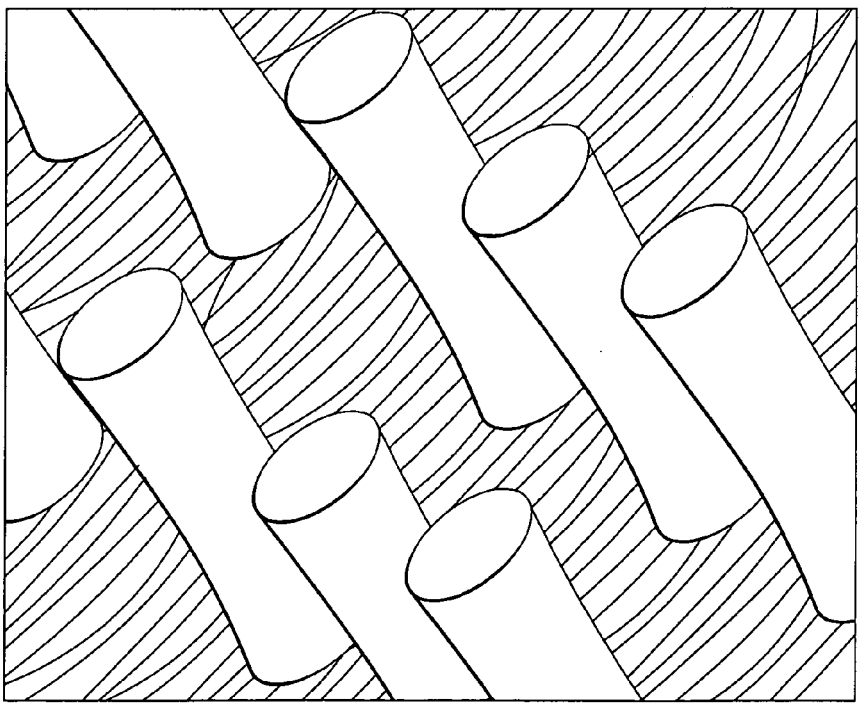
FIG. 12 illustrates high aspect ratio (1:5) nano-structured copper interconnects 20 μm wide and 100 μm tall according to a preferred embodiment of the present invention.
Figure 13:
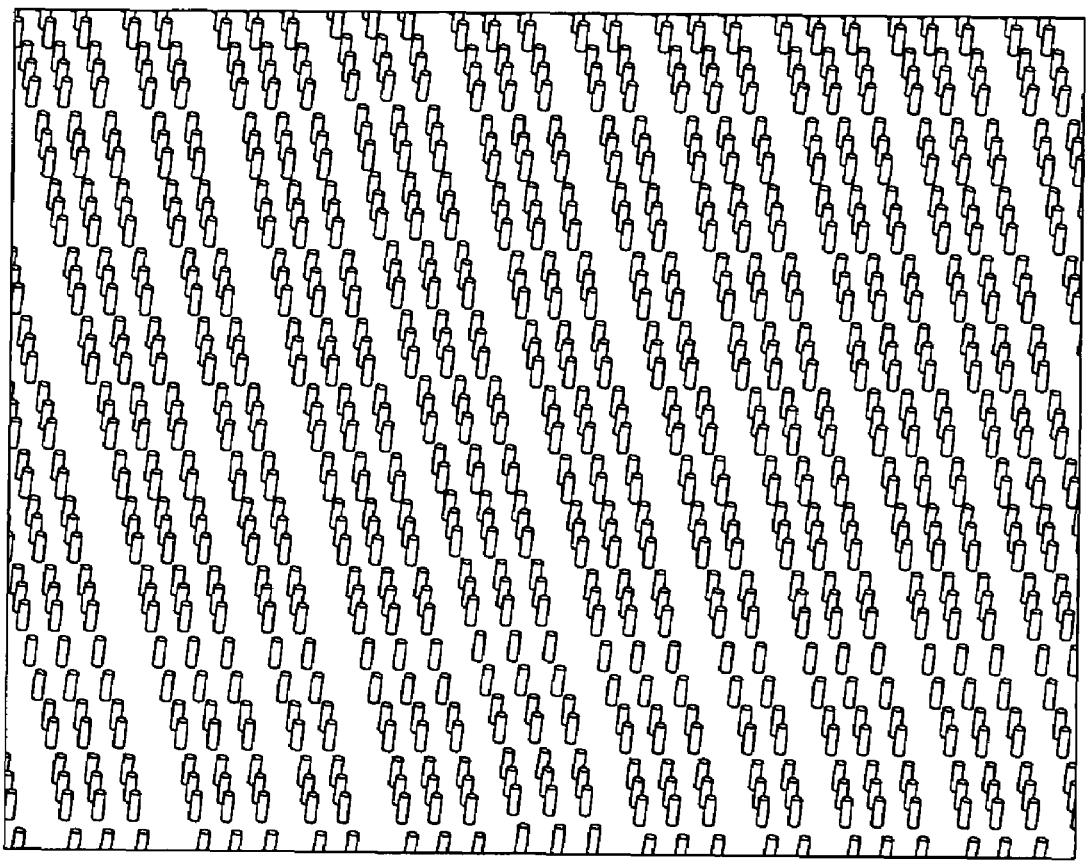
FIG. 13 is an area array fabrication of high aspect ratio (1:5) nano-structured copper interconnects 20 μm wide and 100 μm tall with a pitch of 40 μm according to a preferred embodiment of the present invention.
Figure 14:
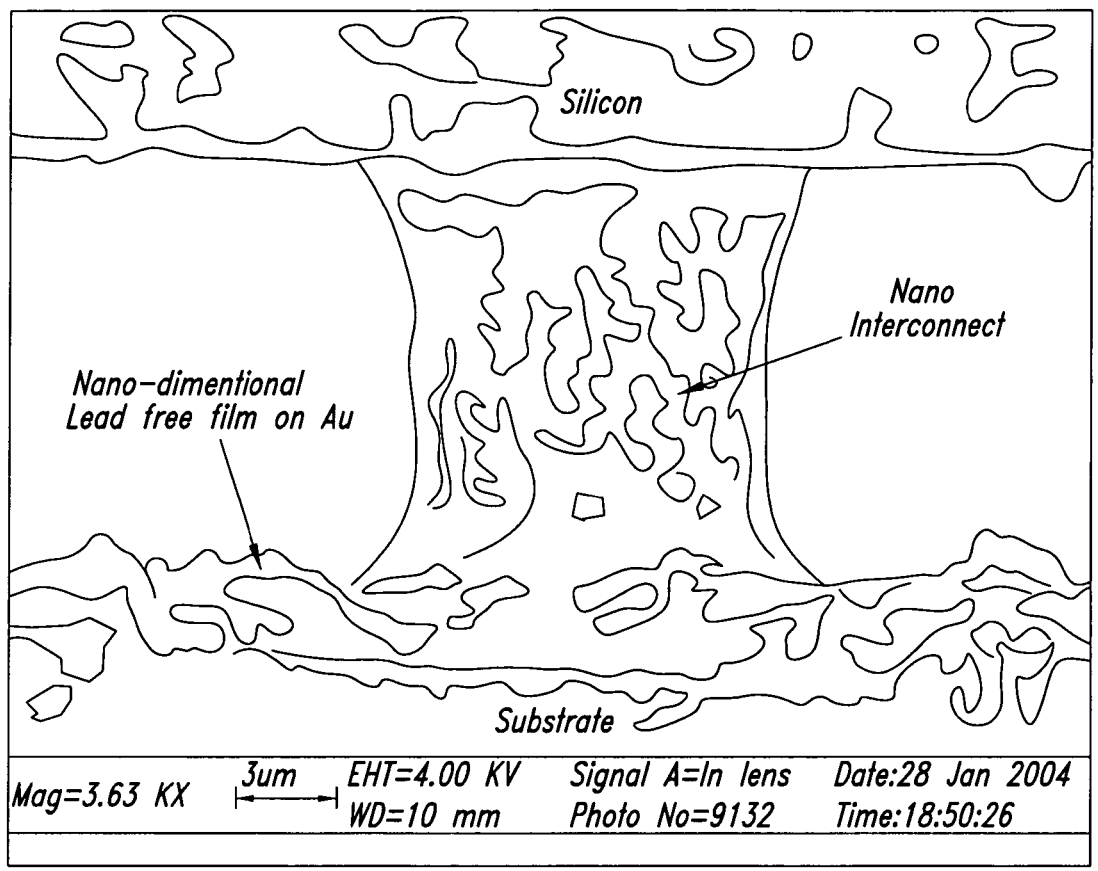
FIG. 14 is a SEM of a 10 μm diameter interconnect bonded to a gold pad using nano lead-free solder film according to a preferred embodiment of the present invention.
Figure 15:
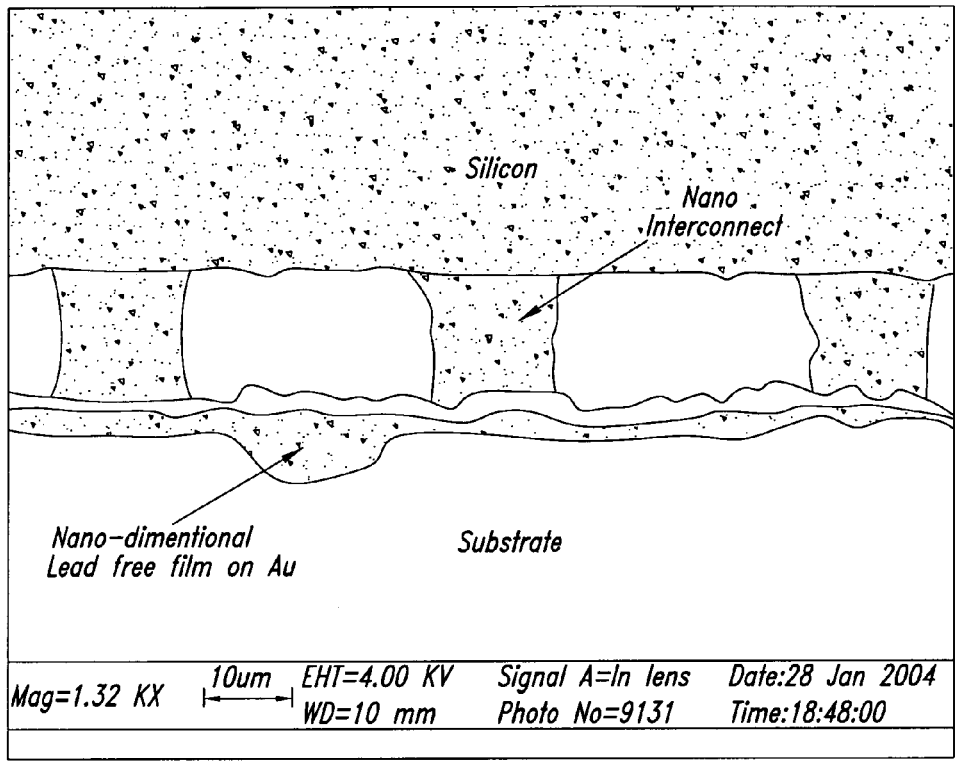
FIG. 15 is a SEM showing an array of 10 μm diameter interconnects bonded to a gold pad using nano lead-free solder film according to a preferred embodiment of the present invention.
Figure 16:
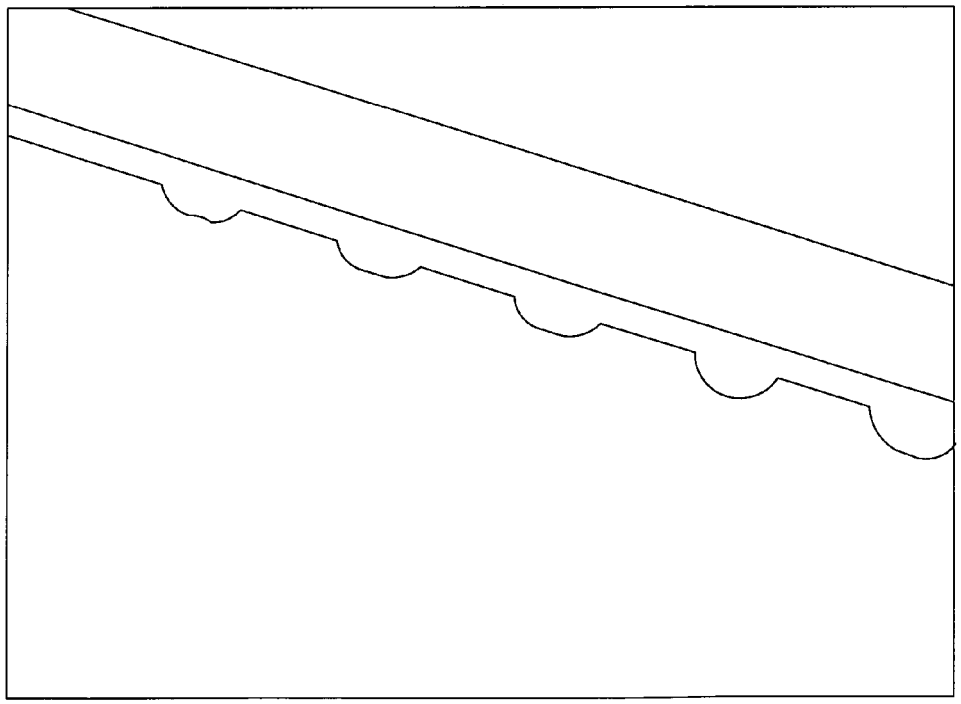
FIG. 16 illustrate nano interconnects assembled at 50 μm pitch using a reworkable interface of lead-free solder according to a preferred embodiment of the present invention.
Figure 17:
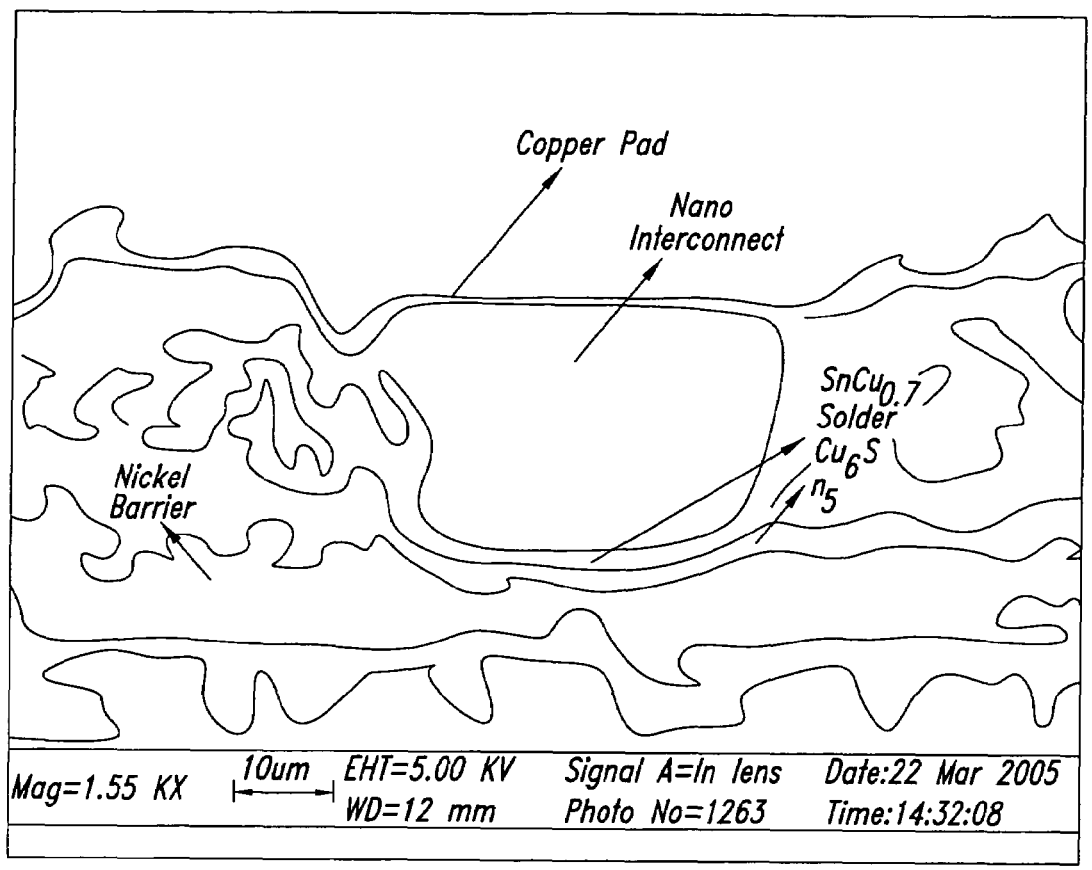
FIG. 17 illustrates a cross-section of nano interconnect with intermetallics and barrier metallurgy according to a preferred embodiment of the present invention.

In this work, interconnects with 20 µm diameter, 100 µm height and 40 µm pitch were fabricated on a Silicon wafer. Shown in FIGS. 11-13, are the high aspect ratio nano-structured copper interconnects grown from the bottom seed layer using electrolytic plating. A current of 10-20 mAmps was used to plate these structures. The process can be subsequently modified to fabricate interconnects with optimum compliancy and electrical properties.

Demonstration of Reworkable Nano Interconnects

The primary interconnects were fabricated by electroplating through the SU-8 trenches. These interconnects were fabricated on a chrome coated silicon wafer to ensure the adhesion between copper interconnects and the silicon. The process can be easily modified to fabricate the interconnects on any desired pad metallurgy. FIGS. 14-17 illustrate interconnects according to preferred embodiments of the present invention.

The bonding capability of nano-dimensional lead-free alloy films obtained by the electroless plating technique was evaluated in this part of the work. Lead-free solder films were electroless plated on an organic laminate (FR-4) as well as a gold coated silicon wafer. These nano-dimensional films should be able to provide the mechanical and electrical interface between the nano-interconnects and metal pads on the substrate.

Assembly was accomplished with the lead-free solder film deposited on the top of the nano interconnects. Bonding is preferably achieved by applying pressure to the chip for less than 10 seconds, while the reflow temperature was kept at approximately 250° C. A thin coating of flux (9171, Alfa Metals) was deposited by spin coating on the lead-free alloy film on metal pads before bonding. Such a bond can allow subsequent removal of the chip by locally heating the bonding interface.

While the invention has been disclosed in its preferred forms, it will be apparent to those skilled in the art that many modifications, additions, and deletions can be made therein without departing from the spirit and scope of the invention and its equivalents, as set forth in the following claims.

We claim:

1. In a silicon bonding process, providing nanodimensional bonding interfaces, the process including the steps of using lead-free film in the bonding process to bond the silicon to a substrate, the improvement to the bonding process comprising:

synthesizing the lead-free film using a sol-gel process, wherein the sol-gel process comprises:
 forming a precursor solution;
 depositing the precursor solution on at least one bonding pad to form a sol-gel film; and convening the sol-gel film to a nanostructured metal bonding layer over the at least one bonding pad; and bonding the silicon to the substrate with the nanostructured metal bonding layer.

2. The bonding process of claim 1, wherein depositing the precursor solution comprises using a spin-coating process.

3. The bonding process of claim 1, wherein depositing the precursor solution comprises using a dip-coating process.

4. The bonding process of claim 1, wherein depositing the precursor solution comprises using a curtain coating process.

5. The bonding process of claim 1, wherein depositing the precursor solution comprises using a meniscus coating process.

6. The bonding process of claim 1, wherein the converting comprises reducing sol-derived oxides from the sol-gel process in a reducing gas environment.

7. The bonding process of claim 6, wherein the reducing gas environment is a hydrogen gas environment.

8. The bonding process of claim 6, wherein reducing sol-derived oxides from the sol-gel process occurs at temperatures of between approximate 200° C. and 500° C.

9. The bonding process of claim 6, wherein reducing sol-derived oxides from the sol-gel process occurs at temperatures of between approximate 200° C. and 500° C.

10. The bonding process of claim 6, further comprising reducing the temperature at which reducing sol-derived oxides from the sol-gel process takes place by controlling a hydrolysis of the sol-gel film.

11. The bonding process of claim 1, further comprising using the lead-free sol-gel film for hermetic sealing of a MEMS/microfluidic package.

12. The bonding process of claim 1, further comprising incorporating at least one metal precursor through the sol-gel process to improve the strength of the film.

13. The bonding process of claim 1, further comprising incorporating at least one metal precursor through the sol-gel process to improve the creep properties of the sol-gel film.

14. The bonding process of claim 1, further comprising incorporating at least one metal precursor through the sol-gel process to improve the fatigue resistance of the sol-gel film.

15. The bonding process of claim 1, further comprising incorporating at least one of Zr, V, Nb, titania, alumina or other pinning agents through the sol-gel process.

16. The bonding process of claim 1, wherein forming a precursor solution comprises forming a metal precursor solution.

17. The bonding process of claim 16, wherein the metal precursor solution is selected from the group consisting of Sn, In, Bi, Ni, Cu, Ag, Au, Co, V and Nb.

18. A process for using a lead-free film to bond silicon to a substrate, the process comprising:

forming a precursor solution for a lead-free film;

depositing the precursor solution on at least one bonding pad to form the lead-free sol-gel film;

reducing the lead-free sol-gel film effective to form a nanostructured lead-free metal bonding layer over the at least one bonding pad; and bonding silicon to the substrate with the nanostructured metal bonding layer.

* * * * *